United States Patent
Johnson et al.

(10) Patent No.: US 10,510,504 B2
(45) Date of Patent: Dec. 17, 2019

(54) FORCE AMPLIFIED LOW PRESSURE DEPTH ACTIVATED SWITCH

(71) Applicant: Eagle Technology, LLC, Melbourne, FL (US)

(72) Inventors: Brannen L. Johnson, Palm Bay, FL (US); G. Randell Straley, Melbourne, FL (US); Jeffrey M. Rhein, Sebastian, FL (US); Sean P. Marikle, Sebastian, FL (US)

(73) Assignee: Eagle Technology, LLC, Melbourne, FL (US)

( * ) Notice: Subject to any disclaimer, the term of this patent is extended or adjusted under 35 U.S.C. 154(b) by 59 days.

(21) Appl. No.: 15/835,664

(22) Filed: Dec. 8, 2017

(65) Prior Publication Data

US 2019/0180965 A1 Jun. 13, 2019

(51) Int. Cl.
| | | |
|---|---|---|
| H01H 35/24 | (2006.01) | |
| H01H 35/34 | (2006.01) | |
| H01H 59/00 | (2006.01) | |
| H05K 5/06 | (2006.01) | |
| H01H 9/04 | (2006.01) | |

(52) U.S. Cl.
CPC .......... *H01H 59/0009* (2013.01); *H01H 9/04* (2013.01); *H01H 35/24* (2013.01); *H01H 35/245* (2013.01); *H01H 35/34* (2013.01); *H05K 5/064* (2013.01)

(58) Field of Classification Search
CPC . F04B 2207/02; E21B 33/0355; H01H 35/24; H01H 35/245; H01H 35/26; H01H 35/34; H01H 35/343; H01H 35/346; H01H 35/345
See application file for complete search history.

(56) References Cited

U.S. PATENT DOCUMENTS

| | | | | |
|---|---|---|---|---|
| 3,739,673 A * | 6/1973 | Temple | .................. | B63B 21/60 114/221 A |
| 5,619,022 A * | 4/1997 | Long | ..................... | H01H 35/34 200/83 A |
| 6,740,828 B1 * | 5/2004 | Dacal | ..................... | F42C 15/30 200/83 J |
| 7,150,228 B2 * | 12/2006 | Scherge | ................. | F42B 3/006 102/263 |
| 2016/0057880 A1 | 2/2016 | Hanke | | |

OTHER PUBLICATIONS

Seacon Positive Action Switches: http://seaconworldwide.com/products/underwater-switches/positive-action-switches/.
Hydracon Subsea: http://www/hydracon.com/submersible-switches/.

\* cited by examiner

*Primary Examiner* — Vanessa Girardi
(74) *Attorney, Agent, or Firm* — Fox Rothschild LLP; Carol E. Thorstad-Forsyth; Robert J. Sacco

(57) ABSTRACT

Systems (100) and methods (2400) for operating a submersible switch positioned below a body of water's surface. The methods comprise: deflecting a semi-rigid top wall of the submersible switch's cap towards a center of the switch when hydrostatic pressure is applied thereto; directly applying a pushing force by the submersible switch's cap onto an actuator of an internal switch disposed in a body of the submersible switch; and causing an operational state change of the submersible switch in response to the pushing force being applied directly to the actuator of the internal switch.

21 Claims, 14 Drawing Sheets

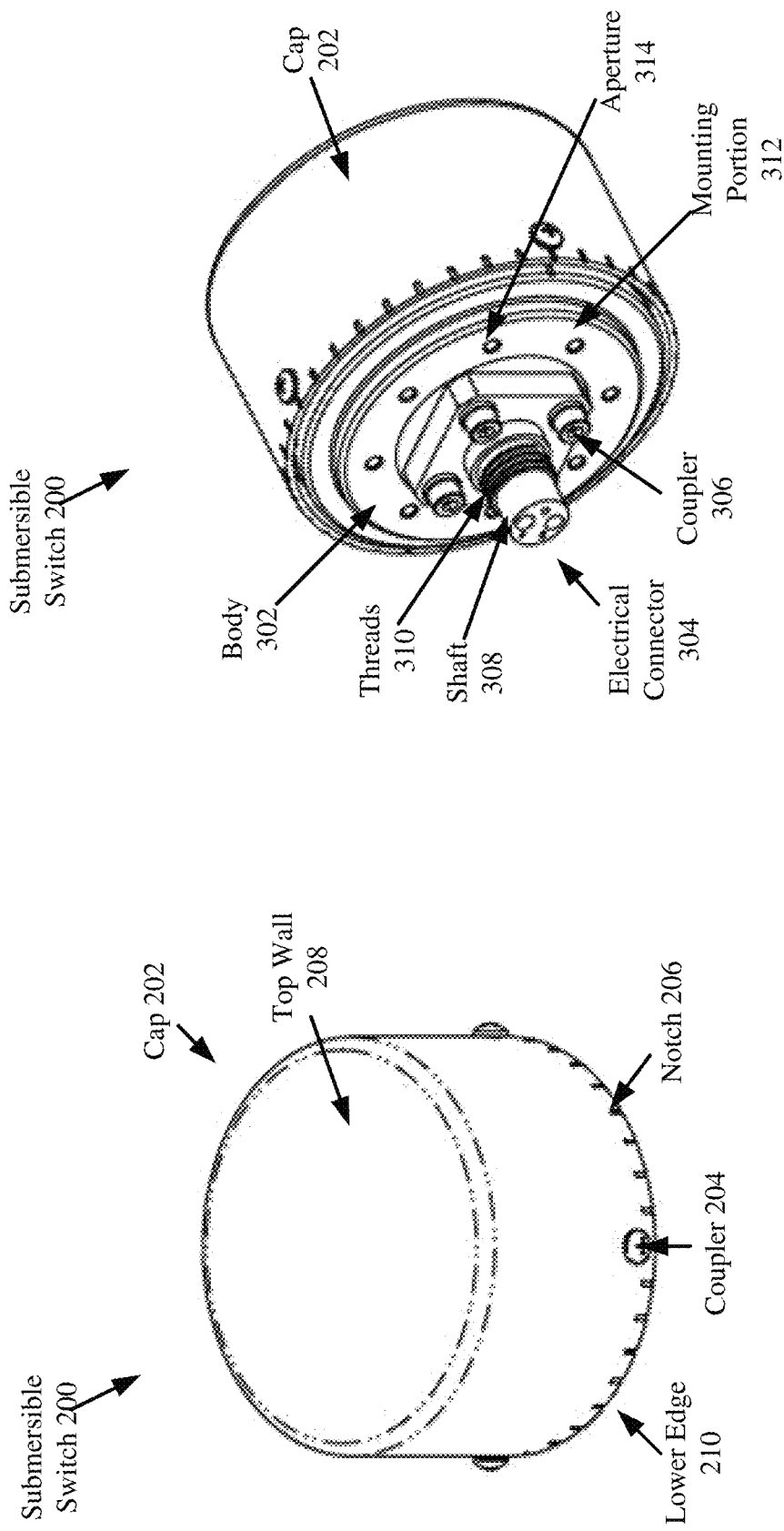

FORCE AMPLIFIED LOW PRESSURE DEPTH ACTIVATED SWITCH

GOVERNMENT RIGHTS

This invention was made with Government support under a classified contract awarded by [federal agency withheld]. The Government may have certain rights in this invention.

FIELD

This document relates generally to switches. More particularly, this document relates to force amplified low pressure activated switch.

BACKGROUND

There are many conventional switches known in the art for sea based applications. These conventional switches include, but are not limited to, pressure switches available from Global Ocean Design of San Diego, Calif. under part number G-117 and G-120. The operational state of the pressure switch may be selected as: a first operational state in which the switch is "on" at the sea's surface and "off" below the sea's surface; or a second operational state in which the switch is "off" at the sea's surface and "on" below the sea's surface. The pressure switches typically trigger between 2-3 atm gauge pressure (or stated differently at 100's of feet below the sea's surface). The pressure switch has a relatively large tolerance. For example, in some cases, the pressure switch has a tolerance of ±100 feet, i.e., the pressure switch will trigger between a 100 or 200 foot range (e.g., 200-300 feet or 200-400 feet below the sea's surface). This relatively large tolerance range is undesirable in many applications. Also, the pressure switch is unreliable since it fails or breaks within a short period of time (e.g., days) after being submerged in water. The failure is often caused by the internal components of the pressure switch. These components can include a sliding piston spring actuator. The triggering is achieved by: the depression of a diaphragm formed of an elastomeric material as a result of pressure being applied thereto from sea water submersion; and the application of a pushing force by the diaphragm to the sliding piston spring actuator.

Some of the conventional pressure switches are modifiable to meet certain criteria for given applications. However, the modified pressure switches are unreliable and inaccurate in certain applications due to complex mechanisms (i.e., pistons and springs) and the failure of elastomeric materials to activate the switch in shallow depths.

SUMMARY

Systems and methods are described herein for operating a pressure switch (e.g., a switch that changes an operational state when air pressure and/or hydrostatic pressure is applied thereto). The pressure switch can include, but is not limited to, a submersible switch positioned below a body of water's surface. The methods comprise: deflecting a semi-rigid top wall of the submersible switch's cap towards a center of the submersible switch when hydrostatic pressure is applied thereto; directly applying a pushing force by the submersible switch's cap onto an actuator of an internal switch disposed in a body of the submersible switch; and causing an operational state change of the submersible switch in response to the pushing force being applied directly to the actuator of the internal switch.

Notably, the submersible switch is repeatably operable in shallow depths (e.g., ≤100 feet below the water's surface) and deep depths (e.g., much >100 feet below the water's surface). A water tight seal is created between the submersible switch's body and the submersible switch's cap. An amount of moisture inside the submersible switch may be controlled.

The trigger depth of the submersible switch is selected by rotating the submersible switch's cap which threadingly engages the submersible switch's body. For example, the trigger depth may be decreased by rotating the submersible switch's cap clockwise, and increased by rotating the submersible switch's cap counter clockwise. A desired rotated position of the submersible switch's cap is maintained during use of the submersible switch via a mechanical coupler (e.g., a screw) engaging a flat engagement surface formed on the submersible switch's body. The submersible switch has a trigger depth tolerance of ±1 foot.

The submersible switch's body has a protruding portion placed in proximity to the semi-rigid top wall of the submersible switch's cap. The protruding portion of the submersible switch's body limits the deflection thereby limiting the stress in the switch's cap in relatively high hydrostatic pressure applications (e.g., depths much greater than 100 feet below the body of water's surface and/or those that are equal to or greater than that at which the stress-strain relationship of the semi-rigid top wall transitions from the elastic region of the curve to a plastic region of the curve). A distance between the protruding portion of the submersible switch's body and the semi-rigid top wall of the submersible switch's cap is selected so that the semi-rigid top wall remains exclusively in the elastic region of a curve representing the semi-rigid top walls stress-strain relationship while the submersible switch is in use at any given depth.

DESCRIPTION OF THE DRAWINGS

The present solution will be described with reference to the following drawing figures, in which like numerals represent like items throughout the figure.

FIG. 2 is a top perspective view of an illustrative assembled submersible switch.

FIG. 3 is a bottom perspective view of the illustrative assembled submersible switch shown in FIG. 2.

DETAILED DESCRIPTION

Figure 1:
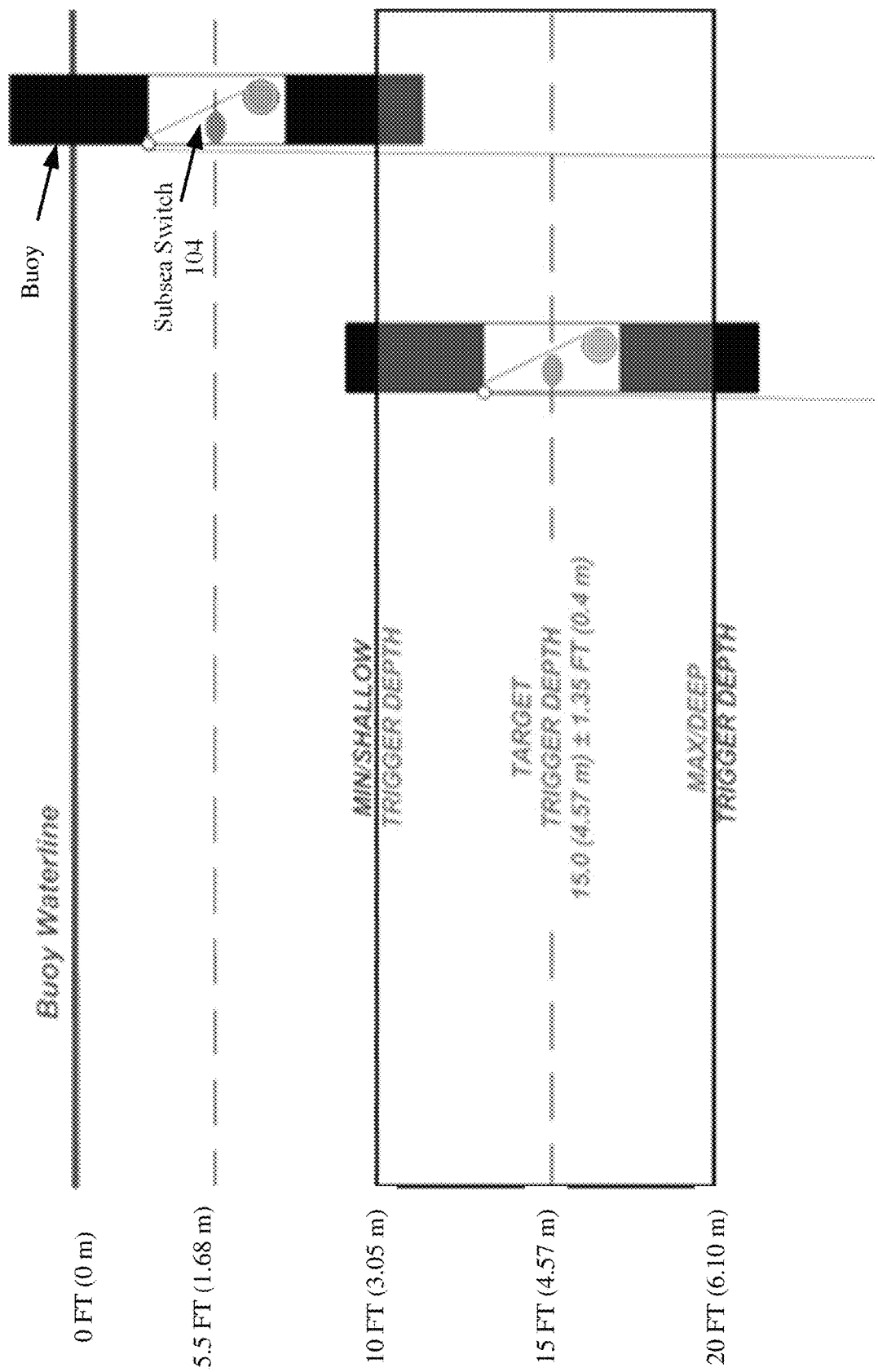
FIG. 1 is an illustration that is useful for understanding operations of an illustrative subsea switch designed in accordance with the present solution.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present solution concerns pressure switches (e.g., switches that change an operational state when air pressure and/or hydrostatic pressure is applied thereto). The pressure switch can include, but is not limited to, a high reliability, electrically passive (no power consumption) submersible switch capable of (a) high precision switch triggering in shallow depths and (b) deep depth survival. The purpose of the submersible switch is that it uses the pressure from sea water submersion to activate (i.e., change states from an off state to an on state, or vice versa). The submersible switch activation can be accomplished at relatively shallow depths (e.g., ≤100 feet). For example, as shown in FIG. 1, the subsea switch 104 is designed to be activated when it reaches 15 feet below the sea's surface. The subsea switch 104 has a ±1 foot tolerance, i.e., the subsea switch 104 will trigger a state change between 14-16 feet. This activation between 14-16 feet is repeatable (i.e., the subsea switch is reliable in that it will trigger between 14-16 feet each time it is used or re-submerged under water). The subsea switch 104 is tunable to a trigger depth less than or greater than 10-20 feet. The present solution is not limited to the particulars of this example. Notably, the submersible switch of the present solution can be used at deep depths (e.g., >100 feet below the sea's surface) as well without failure.

Figure 5:
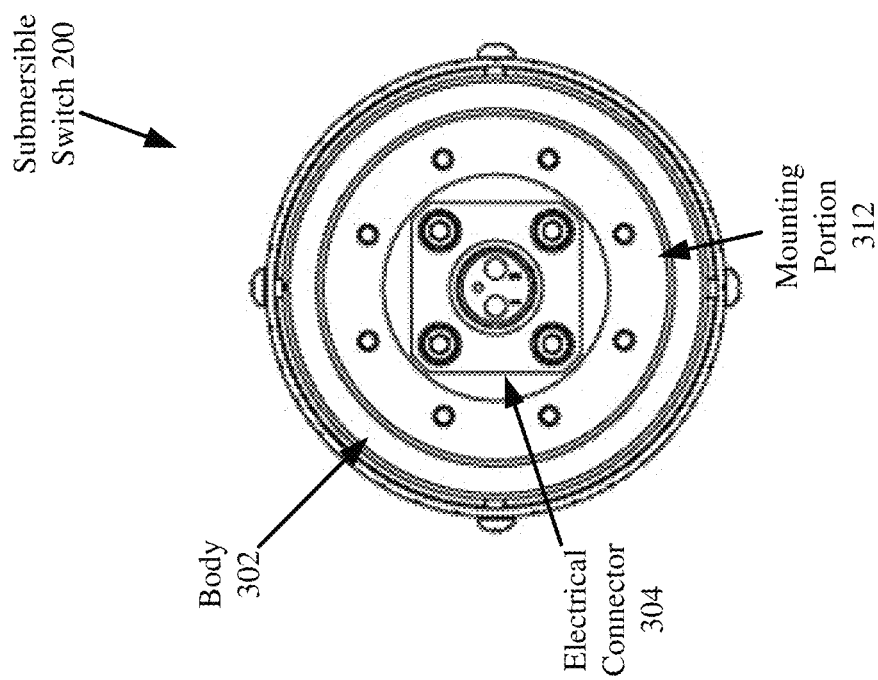
FIG. 5 is a bottom view of the assembled submersible switch shown in FIGS. 2-4.
Figure 4:
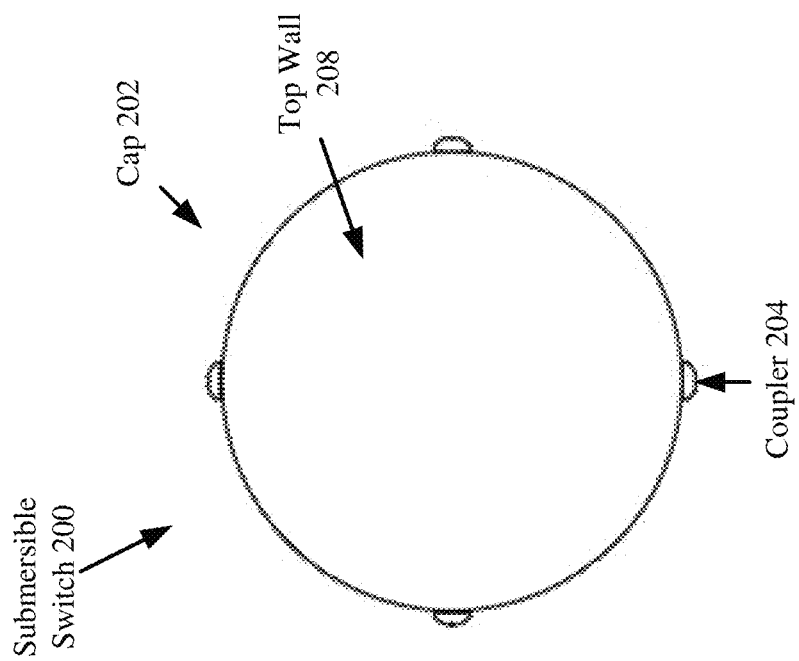
FIG. 4 is a top view of the assembled submersible switch shown in FIGS. 2-3.
Figures 6, 7, 8:
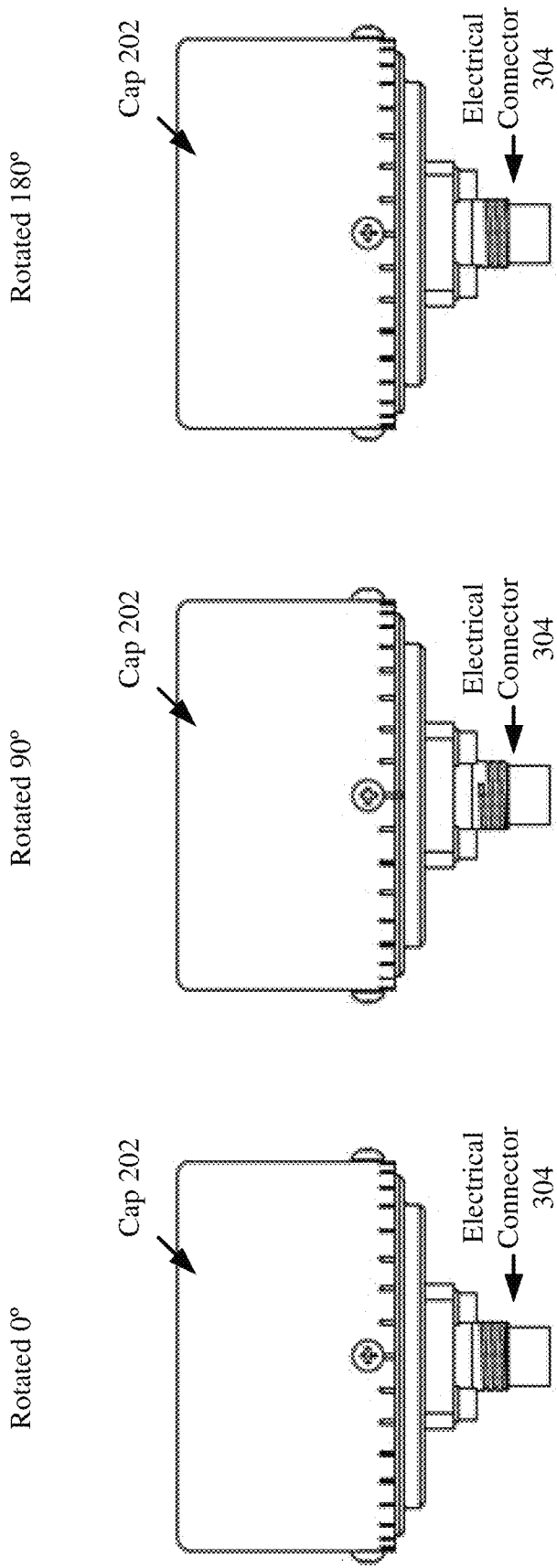
FIGS. 6-8 each provide a side view of the assembled submersible switch shown in FIGS. 2-5.

Referring now to FIG. 2, there is provided a top perspective view of an illustrative assembled submersible switch 200. FIG. 3 provides a bottom perspective view of the submersible switch 200. A top view of the assembled submersible switch 200 is provided FIG. 4. A bottom view of the assembled submersible switch 200 is provided FIG. 5. Side views of the assembled submersible switch 200 are provided in FIGS. 6-8. A cross-sectional view of the assembled submersible switch 200 are provided in FIG. 9. An exploded view of the submersible switch 200 is provided in FIG. 10.

Figure 9:
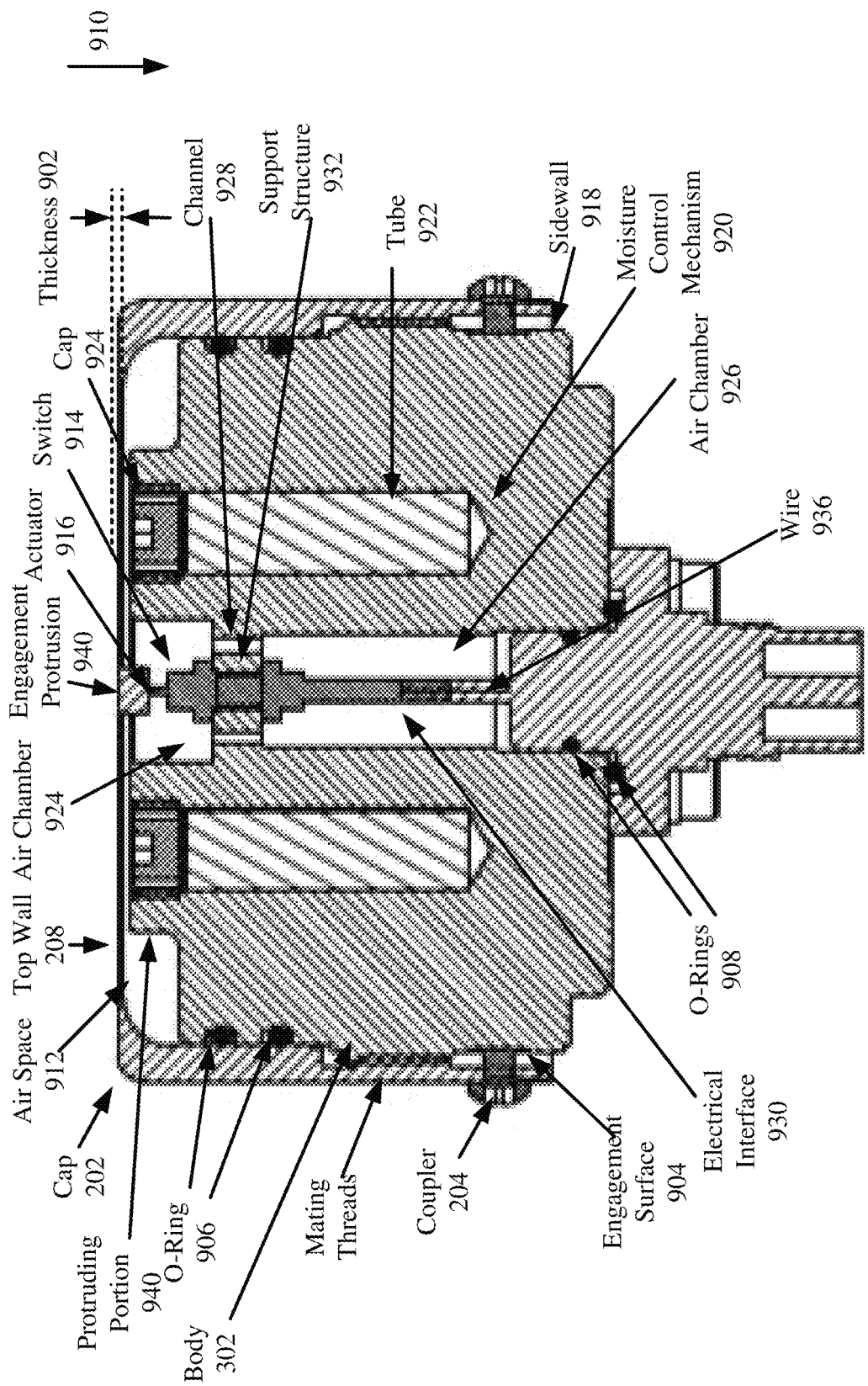
FIG. 9 is a cross-sectional view of the assembled submersible switch shown in FIGS. 2-8.
Figure 10:
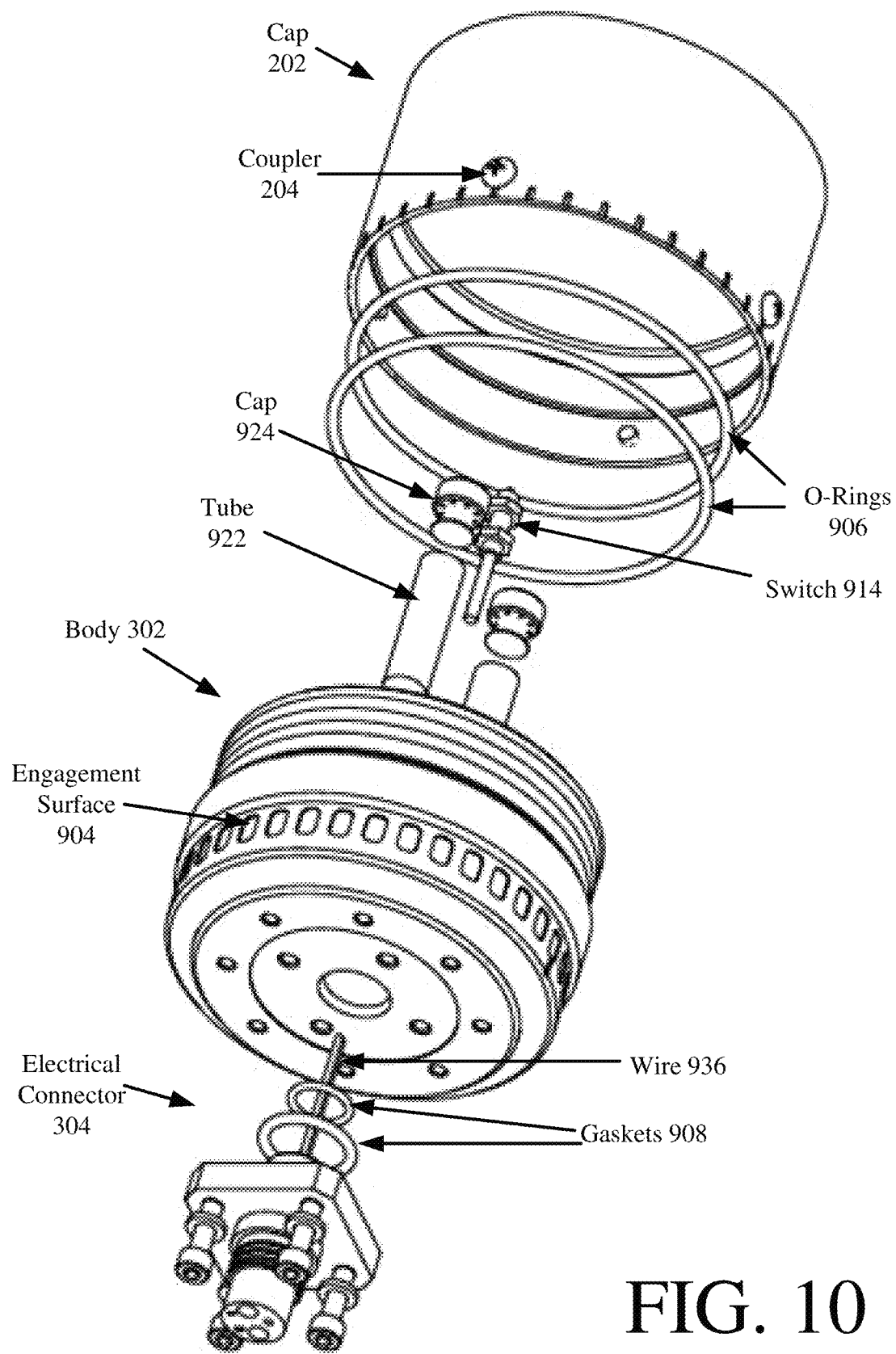
FIG. 10 is an exploded view of the assembled submersible switch shown in FIGS. 2-9.
Figure 12:
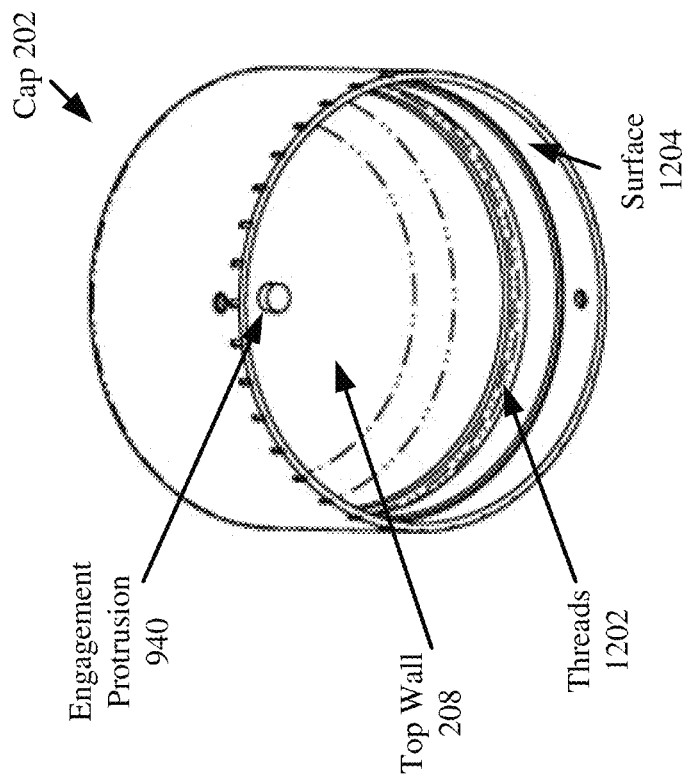
FIG. 12 is a bottom perspective view of the cap shown in FIG. 11.
Figure 11:
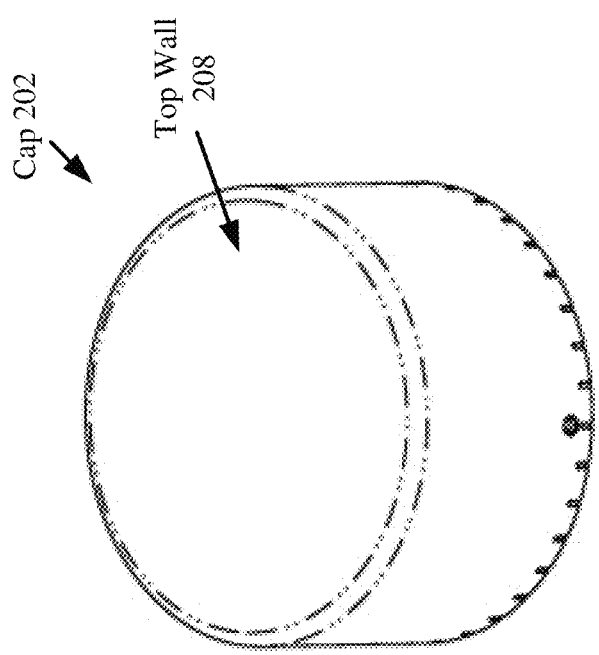
FIG. 11 is a top perspective view of a cap of the submersible switch shown in FIGS. 2-10.
Figure 14:
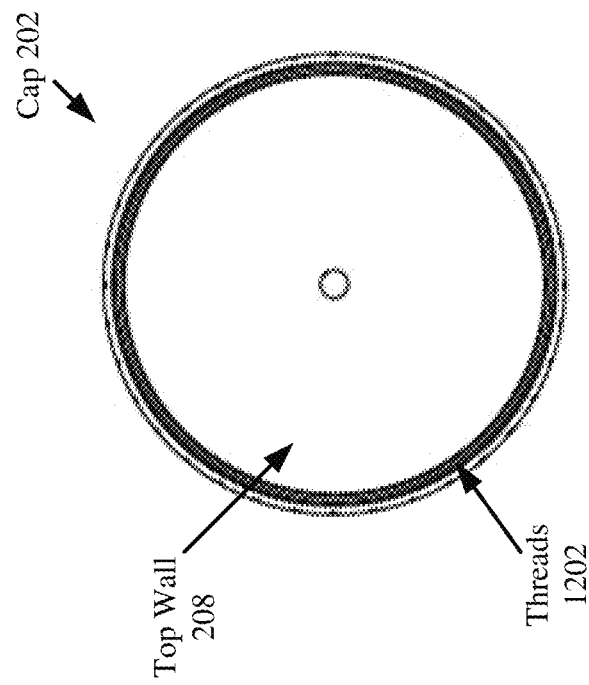
FIG. 14 is a bottom view of the cap shown in FIG. 11.
Figure 13:
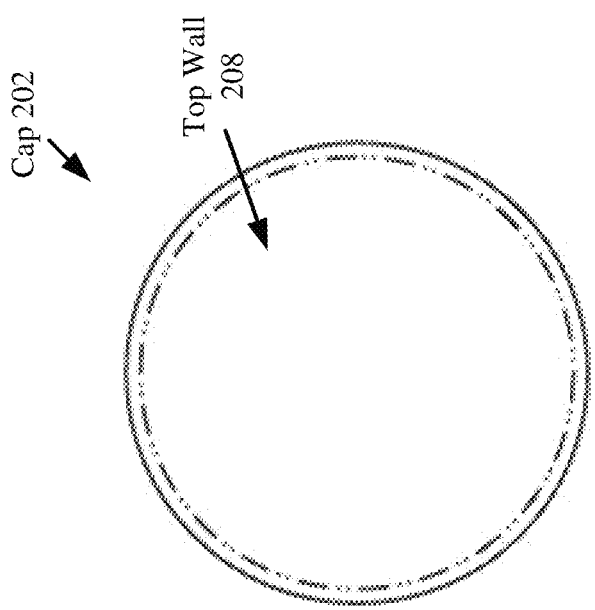
FIG. 13 is a top view of the cap shown in FIG. 11.
Figure 16:
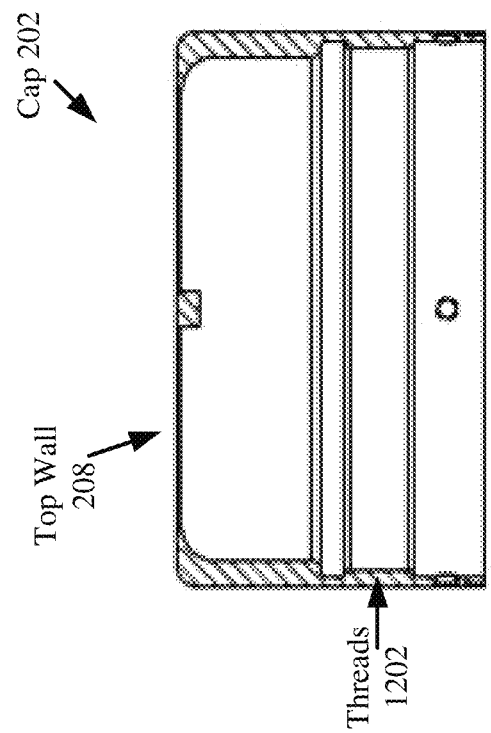
FIG. 16 is a cross-sectional view the cap shown in FIG. 11.
Figure 15:
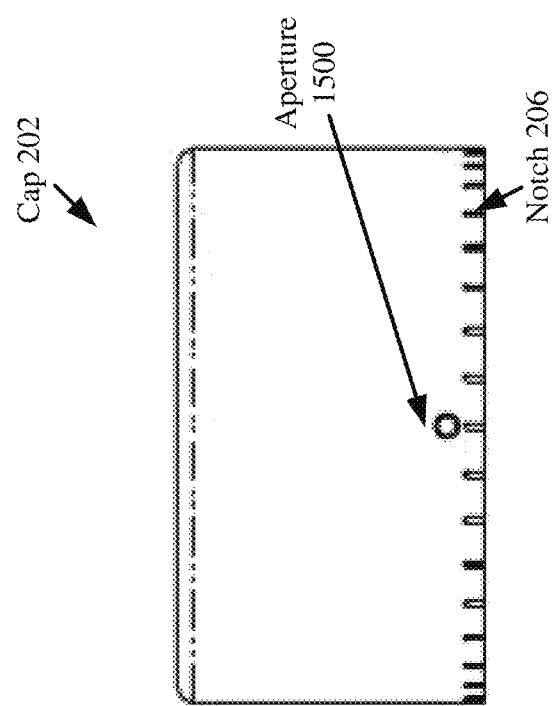
FIG. 15 is a side view of the cap shown in FIG. 11.

FIG. 11 is a top perspective view of a cap of the submersible switch shown in FIGS. 2-10. FIG. 12 is a bottom perspective view of the cap shown in FIG. 11. FIG. 13 is a top view of the cap shown in FIG. 11. FIG. 14 is a bottom view of the cap shown in FIG. 11. FIG. 15 is a side view of the cap shown in FIG. 11. FIG. 16 is a cross-sectional view the cap shown in FIG. 11.

Figure 18:
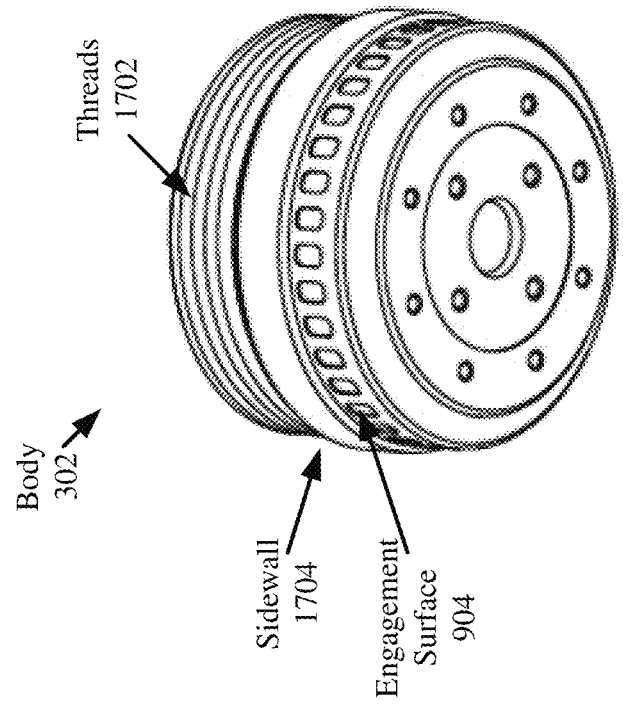
FIG. 18 is a bottom perspective view of the body shown in FIG. 17.
Figure 17:
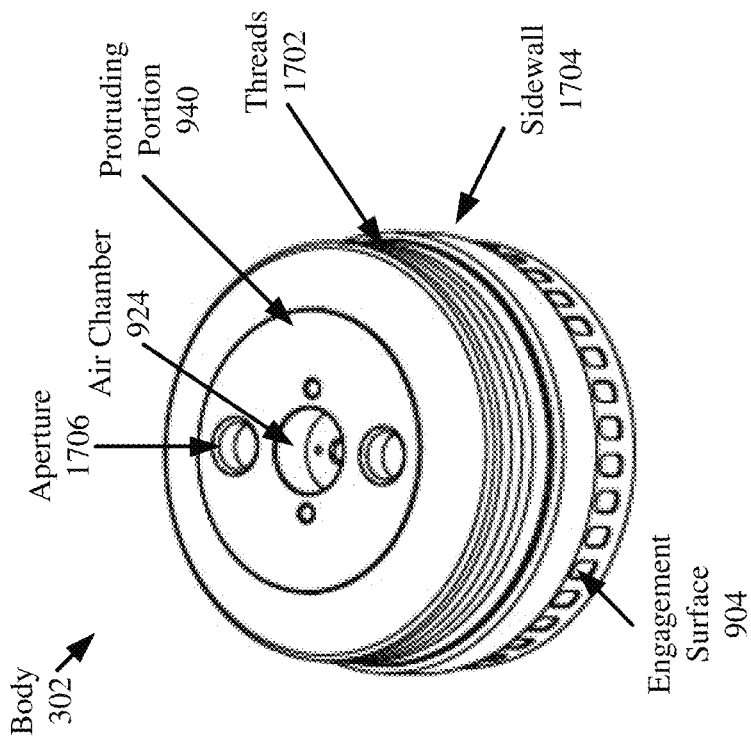
FIG. 17 is a top perspective view of a body of the submersible switch shown in FIGS. 2-10.
Figure 19:
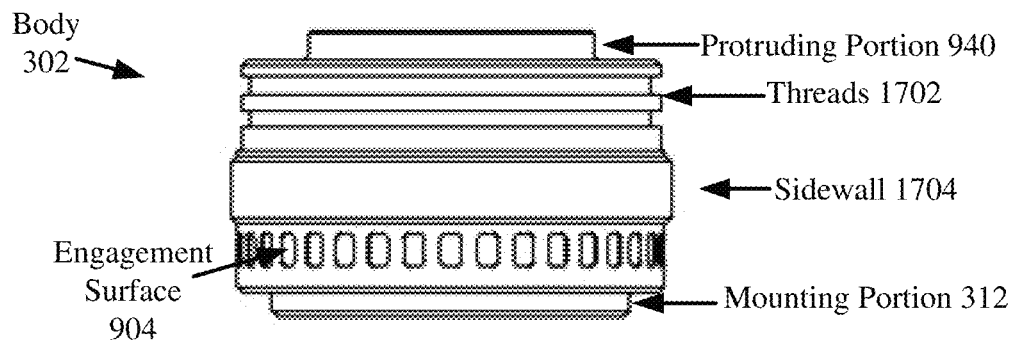
FIG. 19 is a side view of the body shown in FIG. 17.
Figure 20:
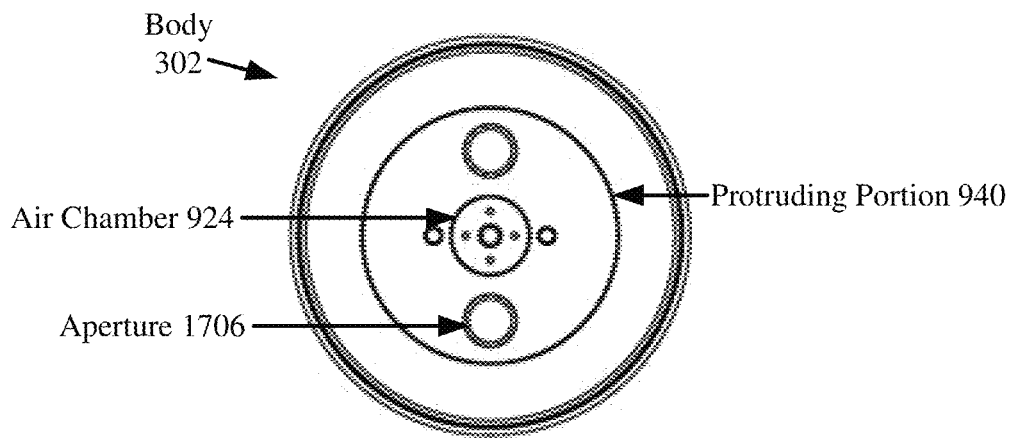
FIG. 20 is a top view of the body shown in FIG. 17.
Figure 21:
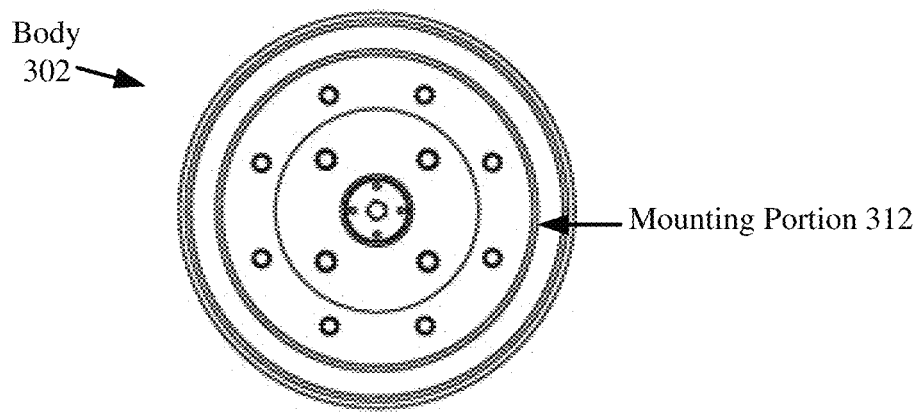
FIG. 21 is a bottom view of the body shown in FIG. 17.
Figure 22:
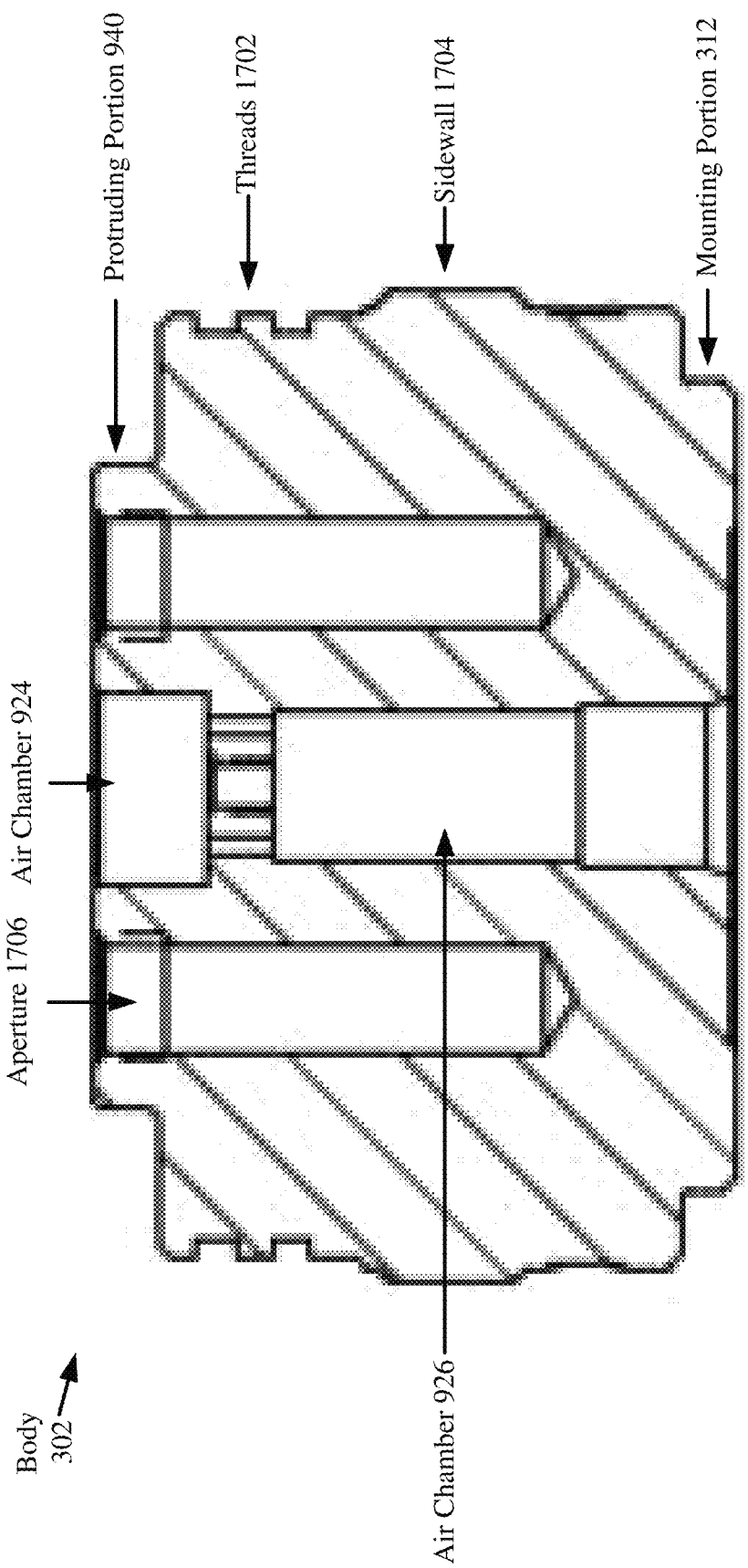
FIG. 22 is a cross-sectional view of the body shown in FIG. 17.

FIG. 17 is a top perspective view of a body of the submersible switch shown in FIGS. 2-10. FIG. 18 is a bottom perspective view of the body shown in FIG. 17. FIG. 19 is a side view of the body shown in FIG. 17. FIG. 20 is a top view of the body shown in FIG. 17. FIG. 21 is a bottom view of the body shown in FIG. 17. FIG. 22 is a cross-sectional view of the body shown in FIG. 17.

The subsea switch 104 of FIG. 1 is the same as or substantially similar to the submersible switch 200 of FIGS. 2-22. Accordingly, the discussion of submersible switch 200 is sufficient for understanding the subsea switch 104 of FIG. 1.

As shown in FIGS. 2-9, the assembled submersible switch 200 comprises a cap 202 threaded onto a body 302. In this regard, the cap 202 comprises threads 1202 on an inner sidewall surface 1204 thereof, as shown in FIGS. 12, 14 and 16. Similarly, the body 302 comprises threads 1702 on an outer sidewall surface 1804 thereof, as shown in FIGS.

17-22. The threads 1202, 1702 are defined to be able to mate to each other. Accordingly, the threads 1202 of the cap 202 threadingly engage threads 1702 of the body 302 so as to rotatably coupled the cap to the body.

The rotatable engagement of the cap 202 and body 302 allows a user to select a desired depth at which an operational state change of the submersible switch 200 will be triggered. Once the cap 202 is rotated by a desired amount, the cap is locked or secured in position by a plurality of couplers 204. The couplers 204 are formed of a rigid material, such as a metal (e.g., titanium). The couplers 204 include, but are not limited to, screws. The couplers respectively pass through apertures 1500 formed through the cap 202, and engage flat engagement surfaces 904 formed on the body 302 (as shown in FIG. 9) so as to secure the cap in its rotated position. A plurality of flat engagement surfaces are formed around the circumference of the body 302, as shown in FIG. 10. This allows any one of a plurality of possible cap positions to be maintained while the switch is in use.

Notably, the cap has a plurality of exposed notches 206 formed around a circumference of a lower edge 210 thereof. The notches 206 provide an indication of the relationship between the degree of cap rotation and the value of the trigger depth for the switch 200. In this regard, the distance between each pair of adjacent notches represents N meters, feet or inches of depth, where N is an integer (e.g., 0.5 feet or 10 feet). The value of N at least partially depends on the thickness 902 of the cap's top wall 208. For example, N has a smaller value when the thickness 902 of the cap's top wall 208 is thinner and a larger value when the thickness 902 of the cap's top wall 208 is thicker. Rotation of the cap in the clockwise direction (i.e., tightening the cap) decreases the trigger depth, while cap rotation in the counter clockwise direction (i.e., loosening the cap) increases the trigger depth. Accordingly, the notches 206 assist a user in accurately selecting a desired trigger depth for the submersible switch 200.

Although a notch 206 is shown every 10° along the circumference of the cap 202, the present solution is not limited in this regard. Any number of notches can be provided in accordance with a particular application.

During use, the cap 202 provides the triggering mechanism for causing a state change of the submersible switch 200 in response to the application of water pressure or hydrostatic pressure thereto. In this regard, the cap 202 is formed of a rigid or semi-rigid material. The rigid or semi-rigid material includes, but is not limited to, a metal (e.g., titanium) and/or a plastic. The cap's top wall 208 has a thickness 902 selected to allow deformation thereof when a given amount of water pressure or hydrostatic pressure is applied thereto, without having a break or fracture created therein. The deformation includes deflecting or bending in an inward direction 910 towards the center of the switch 200. In some shallow depth scenarios (e.g., ≤100 feet), the thickness 9002 has a value in the range of 0.03-0.1 inches. The present solution is not limited to the particulars of this scenario. For example, in other deep depth scenarios (e.g., >100 feet), the thickness could have a value greater than 0.1 inches.

The use of a rigid or semi-rigid material for the cap wall is an important feature of the present solution. In conventional subsea switches, a diaphragm formed of a flexible membrane material is used to allow hydrostatic pressure to actuate a sliding internal component. The membrane material of the diaphragm provides a subsea switch with a relatively high tolerance in relation to its trigger depth (e.g., the trigger depth of the subsea switch is within a 100 foot range). Also, the membrane material becomes permanently damaged at deep depths if the subsea switch is designed for shallow depth applications. The present solution overcomes all of these disadvantages of conventional subsea switches at least partially by the use of a cap formed of a rigid or semi-rigid material rather than a membrane material.

The downward deflecting cap 202 causes an engagement protrusion 940 thereof to directly apply a pushing force on an actuator 916 of a switch 914 disposed in the body 302. Notably, no friction is created between the engagement protrusion 940 and the actuator 916 when the pushing force is being applied to the switch 914. This zero-friction direct-activation of the cap deflection behavior creates a highly repeatable and reliable trip point with no moving mechanisms other than the internal switch. Switches are well known in the art, and therefore will not be described herein. Any known or to be known switch can be used herein without limitation. For example, the switch comprises a Commercial Off The Shelf ("COTS") push button switch having part number PN D5A-1100, which is available from Omron Corporation of Japan. The present solution is not limited to the particulars of this example. Actuation of the switch's actuator causes a state change of the submersible switch 200. The state change can be from the off state to an on state, or vice versa.

A water tight seal is provided between the cap 202 and the body 302. In this regard, at least one O-ring 906 is disposed between the cap 202 and the body 302 when the switch 200 is assembled, as shown in FIG. 9. O-rings are well known in the art, and therefore will not be described herein. Any known or to be known O-ring or other water tight sealing mechanism can be used herein without limitation. Although the O-rings 906 are shown at a location adjacent to the top of the body 302, the O-ring(s) can reside anywhere along the body's sidewall 918. In some scenarios (such as that shown in FIG. 9), the O-ring(s) reside at a location on the body's sidewall 918 above the couplers 204. In the case that the O-ring(s) 906 reside below the couplers 204, a water tight sealing mechanism may also be provided in between the couplers 204 and the cap 202.

The O-ring(s) 906 create an air space 912 inside the switch 200. Moisture may exist in or enter the air space 912. Accordingly, the switch 200 may optionally include at least one moisture control mechanism 920. Moisture control mechanisms are well known in the art, and therefore will not be described herein. Any known or to be known moisture control mechanism can be used herein without limitation. For example, the switch comprises two moisture control mechanisms 920 including a capped tube 922 with moisture control desiccant therein. The tube 922 is capped via cap 924, and disposed in a respective aperture 1706 formed in the body 302. The present solution is not limited to the particulars of this example.

Notably, the body comprises two air chambers 924, 926 in addition to the air space 912. The air chamber 924 is connected to the air space 912, and the air chambers 924, 926 are connected to each other via at least one hollow channel (or vent aperture) 928 formed in the body 302. This allows for the provision of a moisture control mechanism common with that of the air space 912 and two air chambers 924, 926.

The body 302 is designed such that the switch 200 will not be damaged or fail at relatively deep depths and/or when a relatively large amount of hydrostatic pressure is applied thereto. More particularly, the body 302 comprises a protruding portion 940 located adjacent or close to the cap's top wall 208. The protruding portion 940 is designed and strategically located within the switch so that limits the deflection and the stress realized in the cap 202 by the relatively large hydrostatic pressure. In effect, the cap's top wall 208 does not fail or become damaged (i.e., crack, break or fracture) when located at relatively deep depth.

Figure 23:
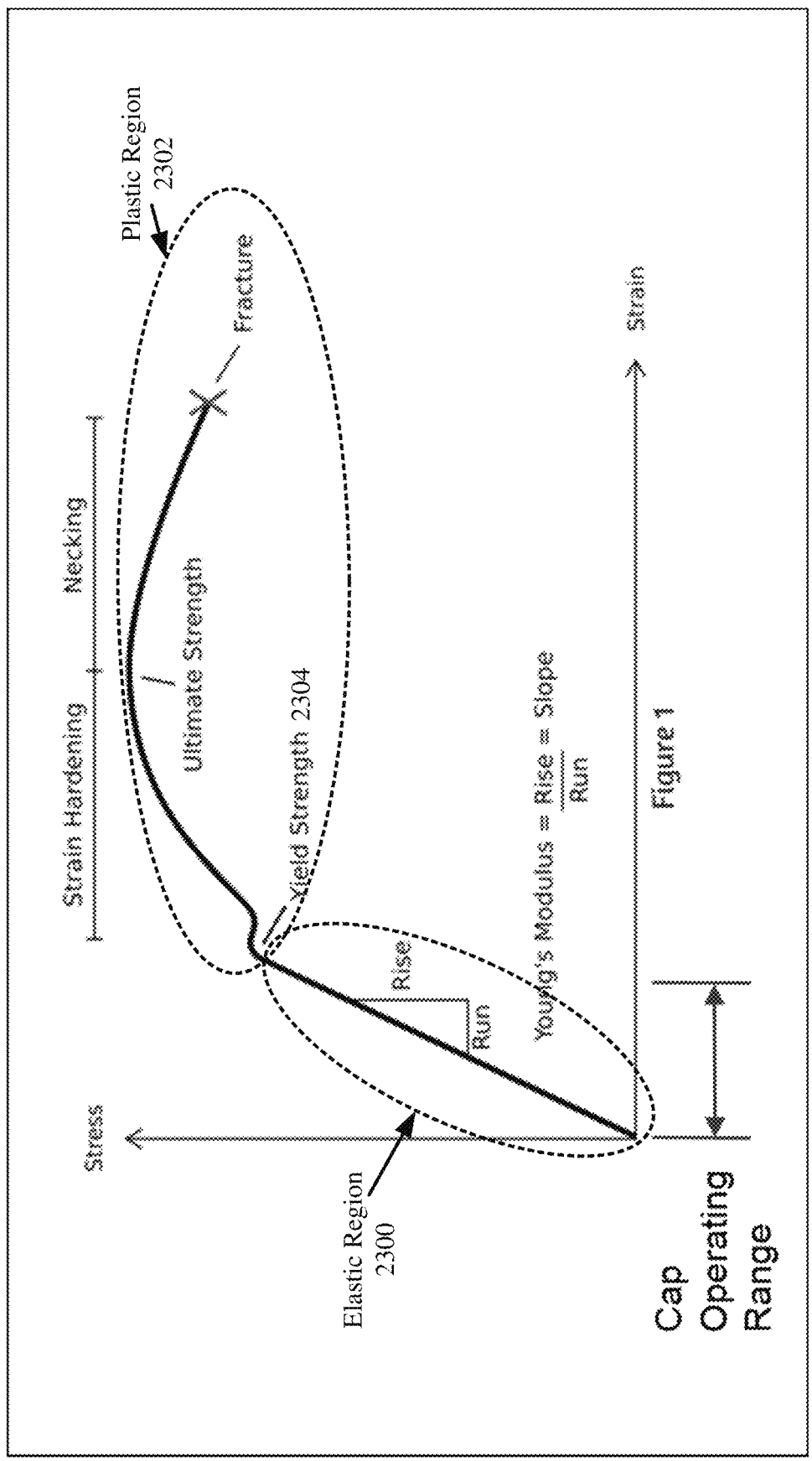
FIG. 23 is a graph that is useful for understanding certain features of the submersible switch shown in FIGS. 2-22 by illustrating a stress-strain relationship of a cap's top wall.

Referring now to FIG. 23, there is provided a graph that is useful for understanding certain features of the submersible switch 200 shown in FIGS. 2-22. The graph plots values of stress on the y-axis and values of strain on the x-axis. In the elastic region 2300, the cap's top wall will return from its deflected state. In the plastic region 2302, the cap's top wall will permanently deform (and possibly fracture) as a result of its deflection. The distance between the body's protruding portion 940 and the cap's top wall 208 is set so that the cap's top surface will not enter the plastic region 2302 during operation of the switch 200 at any depth.

Referring again to FIGS. 2-22, the assembled submersible switch 200 also comprises an electrical connector 304. The electrical connector 304 is coupled to the body 302 via couplers 306 (e.g., screws, bolts, etc.). The electrical connector is electrically connected to the switch 914 via at least one wire 936 at an electrical interface 930. Notably, the switch is structurally supported by a support structure 932 of the body 302 such that its central axis is aligned with that of the electrical connector 304. The switch 914 is maintained in a static or fixed position within the body 302 by having a threaded engagement with the support structure 932.

The electrical connector 304 provides a means for a cable to be coupled to the submersible switch 200 so that the switch can be further connected to other electronics. According, the electrical connector 304 comprises a threaded shaft 308 for coupling the switch 200 to an end of the cable. Electrical connectors are well known in the art, and therefore will not be described in detail herein. Any known or to be known electrical connector suitable for water submersion applications can be used herein without limitation. For example, the electrical connector 304 includes a COTS dual o-ring seal bulkhead connector having part model number FCR1502F, which is available from MacArtney Inc. of Massachusetts. The present solution is not limited to the particulars of this example.

A water tight seal is provided between the electrical connector 304 and the body 302. In this regard, at least one O-ring 908 is disposed between the electrical connector 304 and the body 302 when the switch 200 is assembled, as shown in FIG. 9. Any known or to be known O-ring or other water tight sealing mechanism can be used herein without limitation.

The body 302 also comprises a mounting portion 312 to allow the switch 200 to be mounted on a structure (e.g., a bracket). The mounting part 312 includes, but is not limited to, a plurality of threaded apertures for facilitating the mounting of the switch on the structure.

Figure 24:
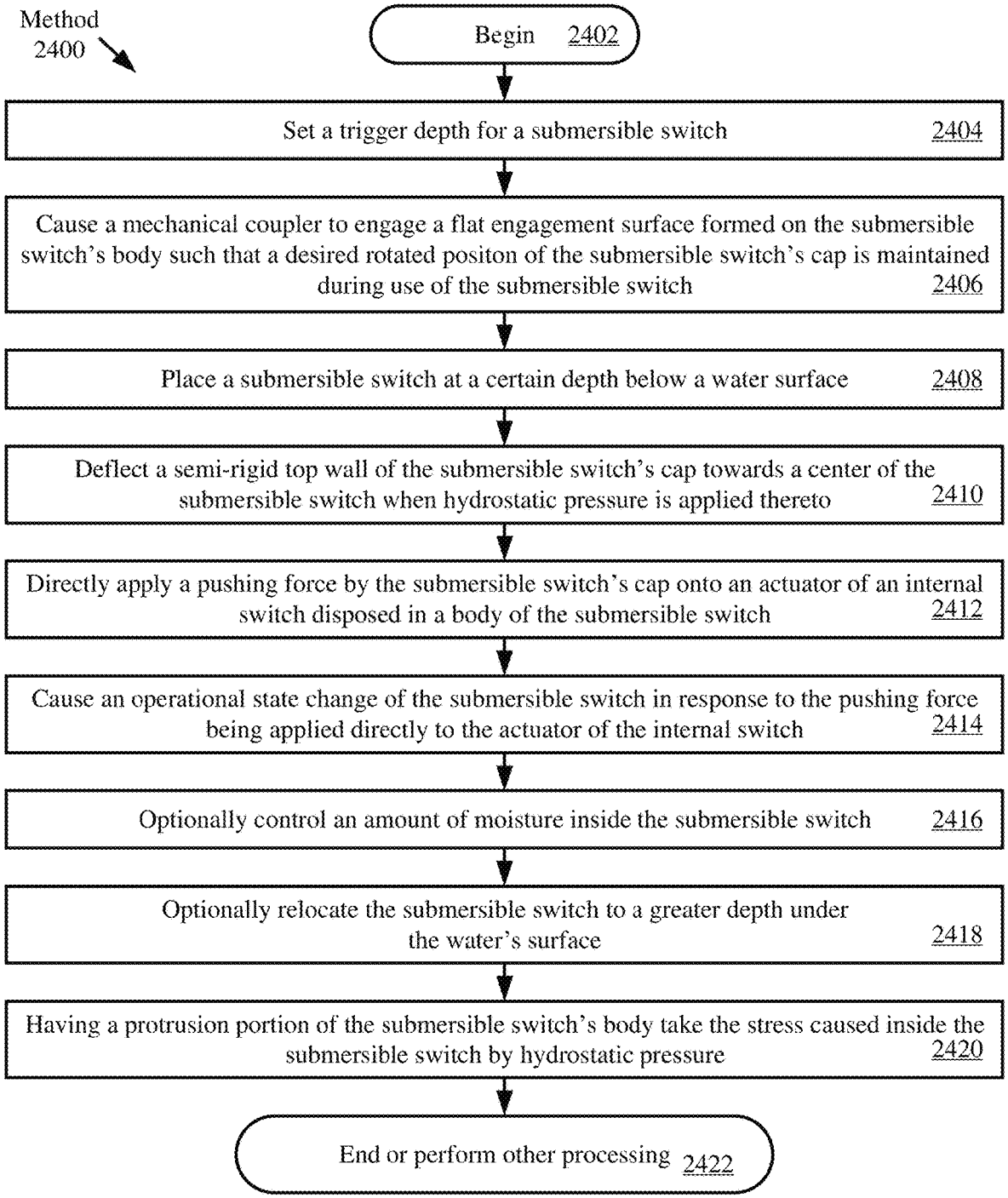
FIG. 24 is a flow diagram of an illustrative method for operating a submersible switch.

Referring now to FIG. 24, there is provided a flow diagram of an illustrative method 2400 for operating a submersible switch (e.g., submersible switch 200 of FIGS. 2-22) at a shallow depth (e.g., ≤100 feet). Method 2400 begins with 2402 and continues with 2404 where a trigger depth for the submersible switch is set. The trigger depth is set by rotating the submersible switch's cap (e.g., cap 202 of FIGS. 2-16) which threadingly engages the submersible switch's body (e.g., body 302 of FIGS. 3-10 and 17-23). In some scenarios, the trigger depth is decreased by rotating the submersible switch's cap clockwise, and increased by rotating the submersible switch's cap counter clockwise. The present solution is not limited to the particulars of this example.

In 2406, a mechanical coupler (e.g., coupler 204 of FIG. 2) is caused to engage a flat engagement surface (e.g., engagement surface 904 of FIG. 9) formed on the submersible switch's body (e.g., body 302 of FIG. 3) such that a desired rotated position of the submersible switch's cap is maintained during use of the submersible switch.

Subsequently, the submersible switch is placed at a certain depth below a water surface, as shown by 2408. Notably, a water tight seal is created between the submersible switch's body and the submersible switch's cap. A semi-rigid top wall of the submersible switch's cap is deflected towards a center of the submersible switch as a result of the hydrostatic pressure being applied thereto, as shown by 2410. As a result of the deflection, a pushing force is directly applied by the submersible switch's cap onto an actuator of an internal switch disposed in a body of the submersible switch, as shown by 2412. This causes an operational state change of the submersible switch, as shown by 2414.

In some scenarios, method 2400 continues with 2416 where an amount of moisture inside the submersible switch is optionally controlled. The submersible switch may also be relocated to a greater depth under the water's surface (e.g., at a depth >100 feet). In this case, a protruding portion of the submersible switch's body (e.g., protruding portion 940 of FIG. 9) takes the stress caused inside the submersible switch by hydrostatic pressure. The hydrostatic pressure has a value equal to or greater than an amount of hydrostatic pressure at which a stress-strain relationship of the semi-rigid top wall transitions from an elastic region of a curve to a plastic region of the curve (i.e., greater than the yield strength 2304 of FIG. 23). Also, a distance between the protruding portion of the submersible switch's body and the semi-rigid top wall of the submersible switch's cap can be selected so that the semi-rigid top wall remains exclusively in an elastic region of a curve representing the semi-rigid top walls stress-strain relationship while the submersible switch is in use at any given depth. Subsequent to completing 2420, 2422 is performed where method 2400 ends or other processing is performed.

All of the apparatus, methods, and algorithms disclosed and claimed herein can be made and executed without undue experimentation in light of the present disclosure. While the present solution has been described in terms of preferred embodiments, it will be apparent to those having ordinary skill in the art that variations may be applied to the apparatus, methods and sequence of steps of the method without departing from the concept, spirit and scope of the present solution. More specifically, it will be apparent that certain components may be added to, combined with, or substituted for the components described herein while the same or similar results would be achieved. All such similar substitutes and modifications apparent to those having ordinary skill in the art are deemed to be within the spirit, scope and concept of the present solution as defined.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

We claim:

1. A submersible switch, comprising:
   an internal switch disposed in a body of the submersible switch;
   a cap rotatably coupled to the body and having a semi-rigid top wall that deflects towards a center of the submersible switch when hydrostatic pressure is applied thereto, and directly applies a pushing force onto an actuator of the internal switch so as to cause an operational state change of the submersible switch;

wherein the body comprises a protruding portion located in proximity to the semi-rigid top wall of the cap; and wherein a distance between the protruding portion of the body and the semi-rigid top wall of the cap is selected so that the semi-rigid top wall remains exclusively in an elastic region of a curve representing the semi-rigid top walls stress-strain relationship while the submersible switch is in use at any given depth.

2. A submersible switch, comprising:

an internal switch disposed in a body of the submersible switch;

a cap rotatably coupled to the body and having a semi-rigid top wall that deflects towards a center of the submersible switch when hydrostatic pressure is applied thereto, and directly applies a pushing force onto an actuator of the internal switch so as to cause an operational state change of the submersible switch;

wherein a trigger depth of the submersible switch is selectable by rotating the cap which threadingly engages the body.

3. The submersible switch according to claim 2, wherein the trigger depth is decreased by rotating the submersible switch's cap clockwise, and increased by rotating the submersible switch's cap counter clockwise.

4. The submersible switch according to claim 2, further comprising a mechanical coupler engaging a flat engagement surface formed on the body such that a desired rotated position of the cap is maintained during use of the submersible switch.

5. A submersible switch, comprising:

an internal switch disposed in a body of the submersible switch;

a cap rotatably coupled to the body and having a semi-rigid top wall that bends towards a center of the submersible switch when hydrostatic pressure is applied thereto, and directly applies a pushing force onto an actuator of the internal switch so as to cause an operational state change of the submersible switch;

wherein an amount of deflection experienced by the semi-rigid top wall of the submersible switch's cap is limited using a protruding portion of the body of the submersible switch; and wherein a trigger depth for the submersible switch is selected by rotating the cap in a given direction.

6. The submersible switch according to claim 5, wherein the submersible switch is repeatably operable in shallow depths of less than 100 feet.

7. The submersible switch according to claim 5, further comprising a water tight seal between the body and the cap.

8. The submersible switch according to claim 5, further comprising an internal component that controls an amount of moisture inside the submersible switch.

9. The submersible switch according to claim 5, wherein the body comprises a protruding portion located in proximity to the semi-rigid top wall of the cap.

10. The submersible switch according to claim 9, wherein the protruding portion of the body limits the deflection and the stress in the cap caused by hydrostatic pressure existing at a depth greater than 100 feet below the body of water's surface.

11. A method of operating a submersible switch positioned below a body of water's surface, comprising:

deflecting a semi-rigid top wall of the submersible switch's cap towards a center of the submersible switch when hydrostatic pressure is applied thereto;

directly applying a pushing force by the submersible switch's cap onto an actuator of an internal switch disposed in a body of the submersible switch;

causing an operational state change of the submersible switch in response to the pushing force being applied directly to the actuator of the internal switch; and placing a protruding portion the submersible switch's body in proximity to the semi-rigid top wall of the submersible switch's cap;

wherein a distance between the protruding portion of the submersible switch's body and the semi-rigid top wall of the submersible switch's cap is selected so that the semi-rigid top wall remains exclusively in an elastic region of a curve representing the semi-rigid top walls stress-strain relationship while the submersible switch is in use at any given depth.

12. A method of operating a submersible switch positioned below a body of water's surface, comprising:

deflecting a semi-rigid top wall of the submersible switch's cap towards a center of the submersible switch when hydrostatic pressure is applied thereto;

directly applying a pushing force by the submersible switch's cap onto an actuator of an internal switch disposed in a body of the submersible switch;

causing an operational state change of the submersible switch in response to the pushing force being applied directly to the actuator of the internal switch; and placing a protruding portion the submersible switch's body in proximity to the semi-rigid top wall of the submersible switch's cap;

wherein the protruding portion of the submersible switch's body limits the deflection and the stress realized in the submersible switch's cap caused by hydrostatic pressure having a value equal to or greater than an amount of hydrostatic pressure at which a stress-strain relationship of the semi-rigid top wall transitions from an elastic region of a curve to a plastic region of the curve.

13. A method of operating a submersible switch positioned below a body of water's surface, comprising:

deflecting a semi-rigid top wall of the submersible switch's cap towards a center of the submersible switch when hydrostatic pressure is applied thereto;

directly applying a pushing force by the submersible switch's cap onto an actuator of an internal switch disposed in a body of the submersible switch;

causing an operational state change of the submersible switch in response to the pushing force being applied directly to the actuator of the internal switch; and selecting a trigger depth for the submersible switch by rotating the submersible switch's cap which threadingly engages the submersible switch's body.

14. The method according to claim 13, wherein the submersible switch has a trigger depth tolerance of ±1 foot.

15. The method according to claim 13, wherein the trigger depth is decreased by rotating the submersible switch's cap clockwise, and increased by rotating the submersible switch's cap counter clockwise.

16. The method according to claim 13, further comprising causing a mechanical coupler to engage a flat engagement surface formed on the submersible switch's body such that a desired rotated position of the submersible switch's cap is maintained during use of the submersible switch.

17. A method of operating a submersible switch positioned below a body of water's surface, comprising:

selecting a trigger depth for the submersible switch by rotating the submersible switch's cap in a given direction;

deflecting a semi-rigid top wall of the submersible switch's cap towards a center of the submersible switch when hydrostatic pressure is applied thereto, where the semi-rigid top wall bends in a direction towards a center of the submersible switch during said deflecting;

limiting an amount of deflection experienced by the semi-rigid top wall of the submersible switch's cap using a protruding portion of a body of the submersible switch;

directly applying a pushing force by the submersible switch's cap onto an actuator of an internal switch disposed in the body of the submersible switch; and causing an operational state change of the submersible switch in response to the pushing force being applied directly to the actuator of the internal switch.

18. The method according to claim 17, wherein the submersible switch is repeatably operable in shallow depths of less than 100 feet.

19. The method according to claim 17, further comprising creating a water tight seal between the submersible switch's body and the submersible switch's cap.

20. The method according to claim 17, further comprising controlling an amount of moisture inside the submersible switch.

21. The method according to claim 17, further comprising placing a protruding portion of the submersible switch's body in proximity to the semi-rigid top wall of the submersible switch's cap.

* * * * *

UNITED STATES PATENT AND TRADEMARK OFFICE
CERTIFICATE OF CORRECTION

PATENT NO. : 10,510,504 B2
APPLICATION NO. : 15/835664
DATED : December 17, 2019
INVENTOR(S) : Brannen L. Johnson et al.

It is certified that error appears in the above-identified patent and that said Letters Patent is hereby corrected as shown below:

On the Title Page

At Item (72): Inventors, Column 1, Line 2 Please replace the name of the Inventor "G. Randell Straley" with the correct spelling "G. Randall Straley".

Signed and Sealed this
Seventeenth Day of March, 2020

Andrei Iancu
*Director of the United States Patent and Trademark Office*